(12) United States Patent
Shino

(10) Patent No.: US 6,919,606 B2
(45) Date of Patent: Jul. 19, 2005

(54) SEMICONDUCTOR DEVICE COMPRISING AN INSULATING MASK FORMED ON PARTS OF A GATE ELECTRODE AND SEMICONDUCTOR LAYER CROSSING AN ACTIVE REGION

(75) Inventor: Tomoaki Shino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 10/025,761

(22) Filed: Dec. 26, 2001

(65) Prior Publication Data

US 2002/0079544 A1 Jun. 27, 2002

(30) Foreign Application Priority Data

Dec. 26, 2000 (JP) ........................................ 2000-395726
Nov. 22, 2001 (JP) ........................................ 2001-358332

(51) Int. Cl.[7] ............................................. H01L 29/76
(52) U.S. Cl. ..................... 257/388; 257/347; 257/350; 257/368; 257/389; 257/638; 257/900
(58) Field of Search ............................... 257/347, 350, 257/368, 384, 638, 900

(56) References Cited

U.S. PATENT DOCUMENTS

| 4,809,056 A | | 2/1989 | Shirato et al. | |
| 4,969,023 A | * | 11/1990 | Svedberg | 257/347 |
| 5,334,870 A | * | 8/1994 | Katada et al. | 257/371 |
| 5,821,575 A | * | 10/1998 | Mistry et al. | 257/281 |
| 2003/0141543 A1 | * | 7/2003 | Bryant et al. | 257/347 |

FOREIGN PATENT DOCUMENTS

| CN | 1186341 | | 7/1998 | |
| CN | 1188982 | | 7/1998 | |
| JP | 61-43475 | | 3/1986 | |
| JP | 62-76675 | | 4/1987 | |
| JP | 05021795 A | * | 1/1993 | ......... H01L/29/784 |
| JP | 05-52672 | | 8/1993 | |
| JP | 6-268215 | | 9/1994 | |
| JP | 10-189756 | | 7/1998 | |
| JP | 10-209443 | | 8/1998 | |

OTHER PUBLICATIONS

Kerry Bernstein, et al., "SOI Circuit Design Concepts", SOI Device Structures, 2000, Chap. 2, Sec. 2.4.2, pp 22–23.

* cited by examiner

Primary Examiner—Tom Thomas
Assistant Examiner—Matthew E. Warren
(74) Attorney, Agent, or Firm—Oblon, Spivak, McClelland, Maier & Neustadt, P.C.

(57) ABSTRACT

A semiconductor device includes a semiconductor layer of a first conductive type formed in an active region, a first gate electrode formed on the semiconductor layer via a gate insulating film in a predetermined pattern, a first insulating mask formed on at least a part of the first gate electrode and a part of the semiconductor layer, and a pair of first diffusion regions of a second conductive type formed in the active region not covered with the first insulating mask and first gate electrode. The pair of first diffusion regions is positioned adjacent to the first gate electrode and being used as a source and drain.

17 Claims, 17 Drawing Sheets

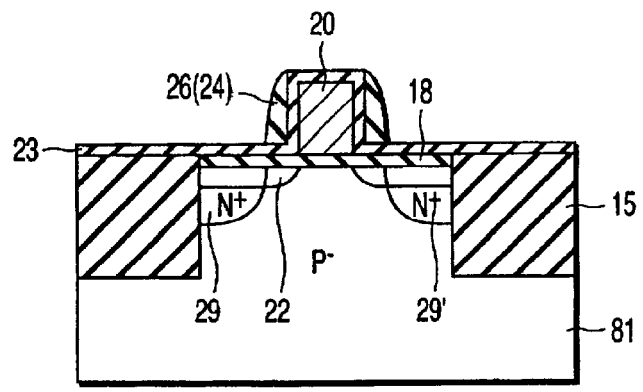
F I G. 20A
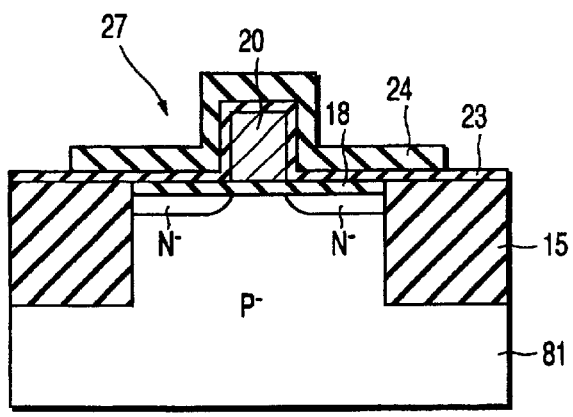
F I G. 20B
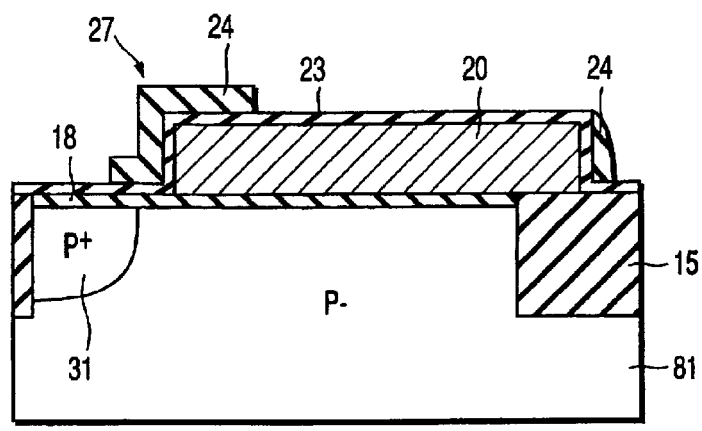
F I G. 20C

US 6,919,606 B2

SEMICONDUCTOR DEVICE COMPRISING AN INSULATING MASK FORMED ON PARTS OF A GATE ELECTRODE AND SEMICONDUCTOR LAYER CROSSING AN ACTIVE REGION

CROSS-REFERENCE TO RELATED APPLICATIONS

The application is based upon and claims the benefit of priority from the prior Japanese Patent Applications No. 2000-395726 filed Dec. 26, 2000, and No. 2001-358332 filed Nov. 22, 2001, the entire contents of both of which are incorporated herein by reference.

BACKGROUND OF THE INVENTION

1. Field of the Invention

The present invention relates to a semiconductor device comprising a metal insulator semiconductor (MIS) transistor formed on a semiconductor layer on an insulating film, and a method of manufacturing the same.

2. Description of the Related Art

For a long time now, a substrate having a single-crystal silicon film formed on an insulating film called the silicon-on-insulator (SOI) substrate, has been the subject of studies since it makes high-performance semiconductor devices. With recent developments in wafer techniques, discussions in the application of the SOI substrate have been increasing.

FIGS. 21 and 22 show a plan view of a semiconductor device according to a conventional NMOS transistor. FIG. 23 is a sectional view of the semiconductor device taken along the line XXIII—XXIII line of FIGS. 21 and 22 in which wiring, contacts, and interlayer insulation films have been omitted.

FIGS. 21–23 shows an SOI substrate 14. The SOI substrate 14 is formed of a buried oxide film 12 formed on a support 11 and a semiconductor layer 13 formed on the buried oxide film 12. Within the semiconductor layer 13, the active region 16 exists in which a p⁻-type substrate-potential controlling layer 17 is formed. On the substrate-potential controlling layer 17, a gate electrode 20 is formed via a gate insulating film 18 in a predetermined pattern. In the surface of the active region 16, N⁺-type source and drain regions 29, 29' are formed adjacent to the gate electrode 20, whereas in the active region 16 facing the source and drain regions 29, 29', a P⁺-type body contact region 31 is formed.

The gate electrode 20 shown in FIG. 21 is formed in a shape of straight line extending from body region to a body extension region, whereas, the gate electrode 20 shown in FIG. 22 has a first portion 20a in a line shape on the body region, and a second portion 20b linked and formed at a right angle to the first portion 20a. The width of the second portion 20b is D2.

In the semiconductor devices mentioned above, the term "body region" refers to the region in which the channel between the source and drain regions 29, 29' is formed. The term "body extension region" refers to a region in contact with the body region at its side boundary making a right angle with a gate-length direction and excluding the source and drain regions 29, 29'. The body contact region 31 is a high-concentration region in contact with the body extension region at its side boundary making a right angle with the gate length direction for making a good contact with an upper electrode.

In the transistor described in the above, the potential of the body region can be controlled by applying a voltage (potential) to the body contact region 3, making it possible to overcome the problem of "substrate-floating effect" associated with the SOI substrate. Also, if the same potential is applied to both the gate electrode 20 and the body region, the threshold voltage of the transistor decreases as the voltage of the gate electrode 20 increases, increasing the drain current. Accordingly, a transistor circuit with a high-performance can be obtained compared to that formed on a bulk substrate.

The substrate floating effect produces adverse effects such as pass-gate leak, history effect, and decreased source-to-drain breakdown voltage. The pass-gate leak used herein refers to the phenomenon in which a current flows between the source and drain when input (source) is switched from a power supply voltage to a ground potential despite the pass gate circuit consisting of an NMOS transistor being turned off (gate is connected to a ground potential). The history effect refers to the phenomenon where the switching speed of an inverter circuit varies depending upon the frequency of the input pulse. These adverse effects will cause circuit malfunction. If an attempt is made to avoid the circuit malfunction, the operation speed of the circuit will decrease.

In the transistor shown in FIG. 21, a PN junction is formed by arranging the high-concentration N-type source and drain regions 29, 29' in a close contact with the high-concentration P-type contact region 31. To maintain the breakdown voltage of the PN junction, these two regions must be arranged at a predetermined distance d (e.g., about 0.3 μm). On the other hand, the source and drain regions 29, 29' and the body contact region 31 are formed by doping N-type and P-type impurity ions through respective openings formed locally on resist patterns. In this manufacturing method, an additional distance s (e.g., about 0.3 μm) must be maintained, taking the alignment tolerance between two resist patterns into account. Accordingly, the distance D1 (d+s) between the source and drain regions 29, 29' and the body contact region 31 must be set at the long distance.

However, if the distance D1 is increased, the area occupied by the transistor increases, making the chip size bigger and increasing the manufacturing cost. Also, increasing the distance D1 increases the parasitic resistance, making it difficult to control the potential of the body region and so causing problems due to the substrate floating effect mentioned previously.

In the transistor shown in FIG. 21, the source and drain regions 29, 29', the P⁻-type substrate-potential controlling layer 17, and the body contact region 31 are formed continuously. Because of this, if a silicide were formed on the surface of the semiconductor layer 13 in a self-alignment manner (i.e., if a salicide is formed), a short circuit would occur between these portions. Therefore, the salicide cannot be formed. However, in a transistor having a gate length of 0.1 μm or less, unless a salicide is formed, the current driving of the transistor will be considerably reduced due to the parasitic resistance between the source and drain, decreasing the switching speed of the transistor circuit.

On the other hand, in the transistor shown in FIG. 22, the source and drain regions 29, 29' and the body contact region 31 are formed by doping N-type and P-type impurity ions, respectively by using the second portion 20b of the gate electrode 20 as a mask for the ion doping. In this manufacturing method, the gate electrode 20, the N-type source and drain regions 29, 29', and the body contact region 31 can be formed in a self-alignment manner such that the high-concentration N-type source and drain regions 29, 29' and high-concentration P-type body contact region 31 are not positioned adjacent to each other. Accordingly, the distance D2 can be reduced by about 0.3 μm compared with that of the transistor shown in FIG. 21, minimizing the increase in area and parasitic resistance. In addition, a salicide can be formed, thus the transistor of FIG. 22 is now generally used as a standard transistor with body contact even for the gate length of 0.1 μm or less.

However, there is still a problem in this case. Since a parasitic gate capacitance is generated in a region 100 in which the second portion 20b of the gate electrode 20 faces the substrate potential controlling layer 17, the switching speed of the transistor circuit decreases.

BRIEF SUMMARY OF THE INVENTION

According to a first aspect of the present invention, there is provided a semiconductor device comprising:

a semiconductor layer of a first conductive type formed in an active region;

a first gate electrode formed on the semiconductor layer via a gate insulating film in a predetermined pattern;

a first insulating mask formed on at least a part of the first gate electrode and a part of the semiconductor layer; and a pair of first diffusion regions of a second conductive type formed in the active region not covered with the first insulating mask and first gate electrode, the pair of first diffusion regions being positioned adjacent to the first gate electrode and being used as a source and drain.

According to a second aspect of the present invention, there is provided a method of manufacturing a semiconductor device comprising:

forming an active region;

forming a semiconductor layer of a first conductive type in the active region;

forming a first gate electrode on the semiconductor layer via a gate insulating film in a predetermined pattern;

forming a first insulating mask on at least a part of the first gate electrode and a part of the semiconductor layer; and forming a pair of first diffusion regions of a second conductive type using as a source and drain in the active region adjacent to the first gate electrode by using the first insulating mask.

BRIEF DESCRIPTION OF THE SEVERAL VIEWS OF THE DRAWING

FIGS. 20A, 20B, and 20C are sectional views of semiconductor devices using a bulk substrate according to embodiments of the present invention;

DETAILED DESCRIPTION OF THE INVENTION

Figure 1:
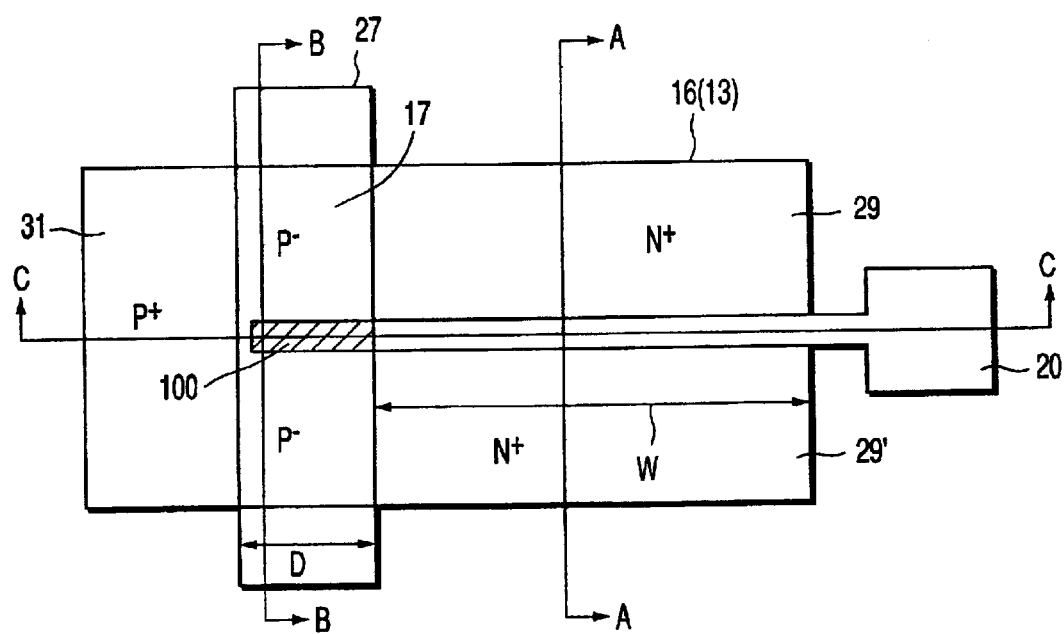
FIG. 1 is a plan view showing a semiconductor device according to a first embodiment of the present invention.

Now, embodiments of the present invention will be explained with reference to the accompanying drawings. In the description which follows, like reference numerals designate like structural elements, throughout the drawings.

In the description described below, the term "body region" refers to the region in which the channel between source and drain regions is formed. The term "body extension region" refers to the region in contact with the body region excluding the region between the source and drain regions. The "body contact region" refers to the high-concentration region in contact with the body extension region, for making a good contact with an upper electrode.

[First Embodiment]

FIG. 1 is a plan view showing a semiconductor device according to a first embodiment of the present invention.

FIG. 1 does not show a spacer and a silicide film formed in a side surface of a gate electrode.

As shown in FIG. 1, a P⁻-type substrate potential controlling layer 17 is formed within an active region 16 of a semiconductor layer 13. On the P⁻-type substrate potential controlling layer 17, a gate electrode 20 is formed via a gate insulating film (not shown) in a predetermined pattern. The gate electrode 20 is a linear pattern extending from an isolation region to the active region 16. The end portion of the gate electrode 20 is arranged within the active region 16. On the end portion of the gate electrode 20 and on the P⁻-type substrate potential controlling layer 17, an insulating mask 27 is formed across the active region 16 along the gate length direction. In the active region 16 adjacent to the gate electrode 20, N⁺-type source and drain regions 29, 29' are formed. Also, a P⁺-type body contact region 31 is formed within the active region 16 so as to face the source and drain regions 29, 29' and the body region in which the channel between the source and drain regions 29, 29' is to be formed adjacent to the insulating mask 27. The distance between the N⁺-type source/drain regions 29 (29') and the P⁺-type body contact region 31 is determined depending upon a width D of the insulating mask 27 in a self-alignment manner.

Note that an N⁻-type extension region (not shown) described later is formed under the insulating mask 27 of the side of the source and drain regions 29, 29' and on the surface of the substrate-potential controlling layer 17 adjacent to the gate electrode 20.

FIGS. 2A, 2B, 2C–7A, 7B, 7C show sectional views of the semiconductor device according to the first embodiment of the present invention in individual manufacturing steps. FIGS. 2A to 7A show sectional views of the semiconductor devices taken along the line A—A of FIG. 1. FIGS. 2B to 7B show sectional views of the semiconductor devices taken along the line B—B of FIG. 1. FIGS. 2C to 7C show sectional views of the semiconductor devices taken along the line C—C of FIG. 1. FIG. 8 is a plan view of a resist pattern for use in a manufacturing step of a semiconductor device according to the first embodiment. In FIG. 8, the N⁻-type extension region is omitted which is formed in the region at which a resist pattern having an opening for an N-type impurity doping region is overlapped with a resist pattern of the insulating mask. Now, a method of manufacturing a semiconductor device according to the first embodiment of the present invention will be explained.

Figure 2A:
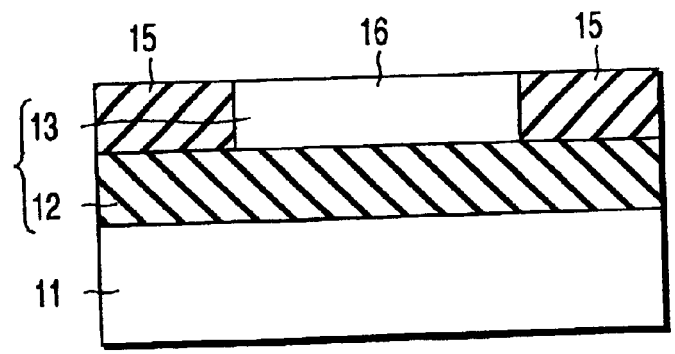
FIGS. 2A, 3A, 4A, 5A, 6A, and 7A are sectional views of the semiconductor device taken long the line A—A of FIG. 1 and showing individual manufacturing steps of the semiconductor device (corresponding to respective sectional views) according to a first embodiment of the present invention.
Figure 2B:
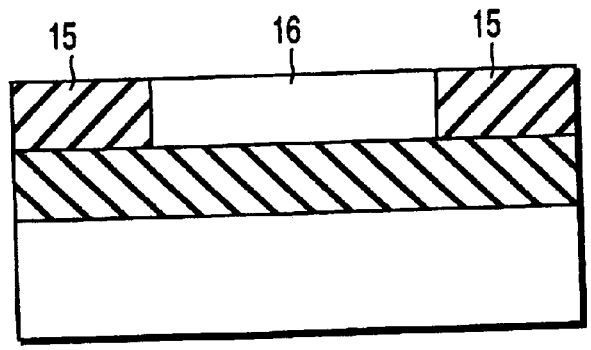
FIGS. 2B, 3B, 4B, 5B, 6B, and 7B are sectional views of the semiconductor device taken long the line B—B of FIG. 1 and showing individual manufacturing steps of the semiconductor device (corresponding to respective sectional views) according to the first embodiment of the present invention.
Figure 2C:
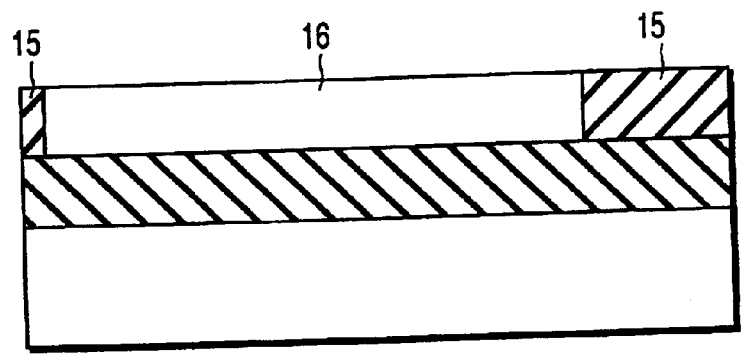
FIGS. 2C, 3C, 4C, 5C, 6C, and 7C are sectional views of the semiconductor device taken long the line C—C of FIG. 1 and showing individual manufacturing steps of the semiconductor device (corresponding to respective sectional views) according to the first embodiment of the present invention.

A silicon-on-insulator (SOI) substrate 14 is formed as shown in FIGS. 2A to 2C. The SOI substrate 14 is constructed of a buried oxide film 12 formed on a support substrate 11 and a semiconductor layer 13 formed on the buried oxide film 12. Subsequently, an field insulating film 15 is formed in the semiconductor layer 13 in a predetermined pattern. In this manner, an active region 16 is formed with an island pattern.

Figure 3A:
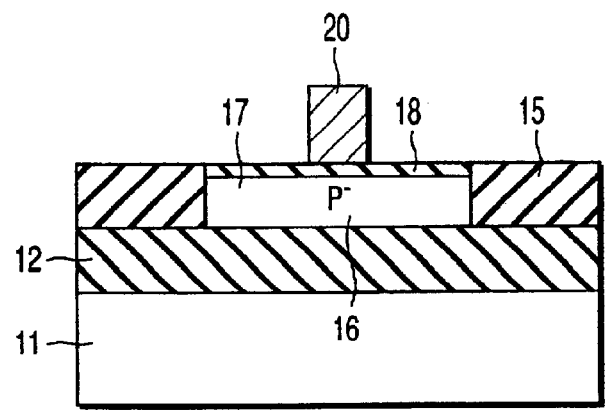
Figure 3B:
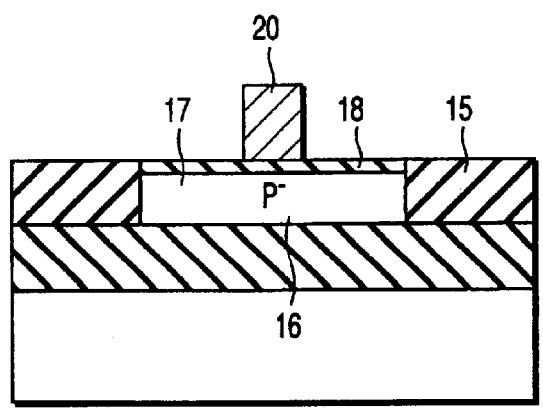
Figure 3C:
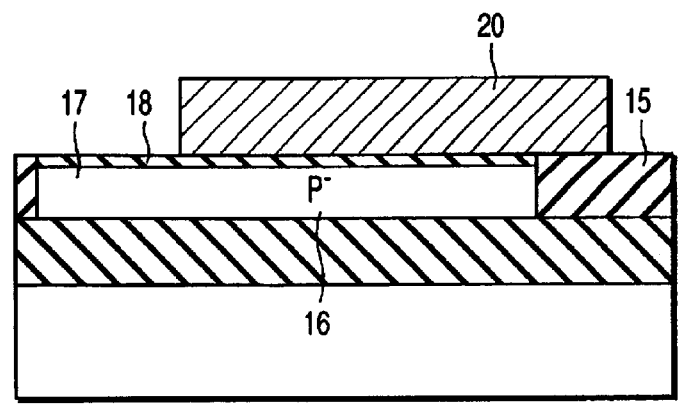

Next, as shown in FIGS. 3A to 3C, p-type impurity ions are introduced into the active region 16 in a concentration of $10^{17}$ to $10^{18}$/cm³ in order to adjust the threshold voltage of a transistor, thereby forming the P⁻-type substrate-potential controlling layer 17. Subsequently, a gate insulating film 18 is formed on the active region 16. On the gate insulating film 18, a polysilicon film is deposited, and then, a resist (not shown) is formed on the polysilicon film. The resist is patterned to form a resist pattern 19 of the gate electrode shown in FIG. 8. Using the resist as a mask, the polysilicon film is removed to form a gate electrode 20 in a predetermined pattern.

Figure 4A:
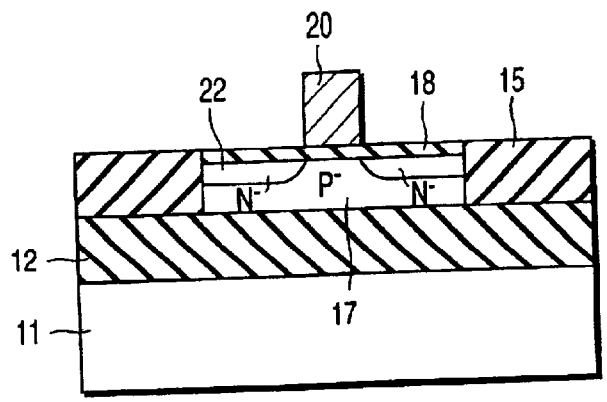
Figure 4B:
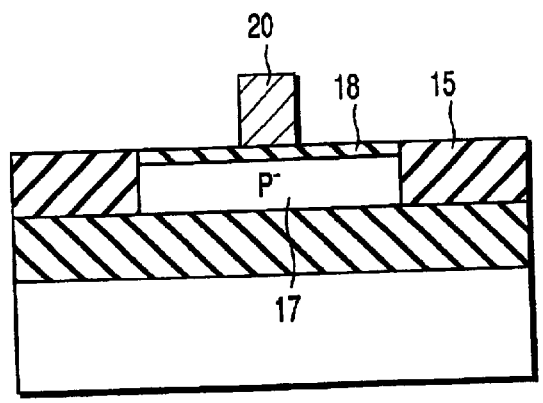
Figure 4C:
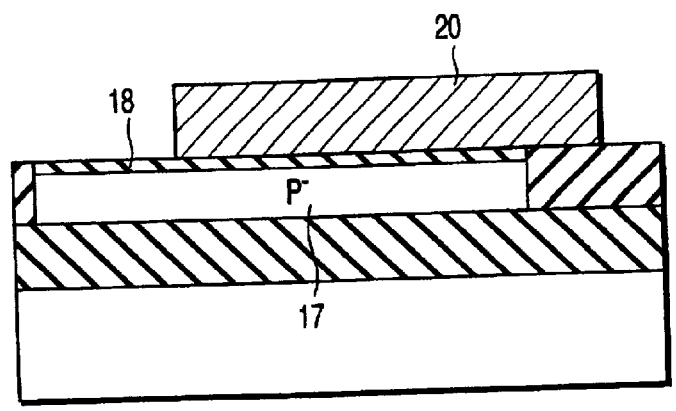

Next, using a resist pattern 21 having an opening for an N-type impurity doping region shown FIG. 8, as a mask, low concentration N-type impurity ions are doped into the surface of the active region 16 to form an N⁻-type extension region 22 as shown in FIGS. 4A–4C.

Figure 5A:
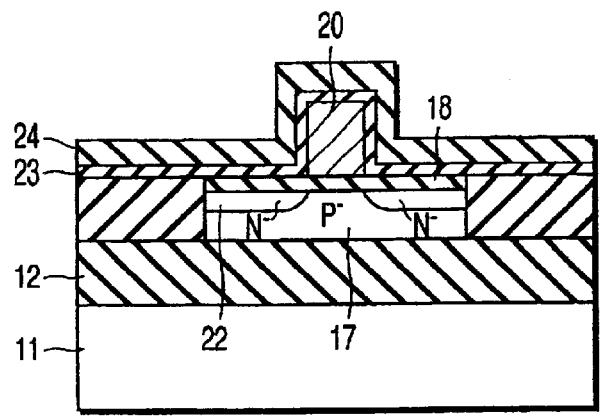
Figure 5B:
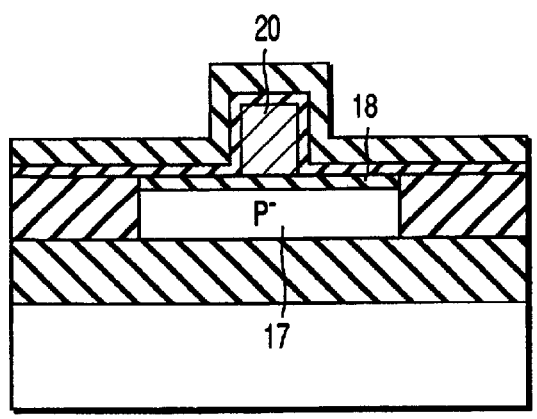
Figure 5C:
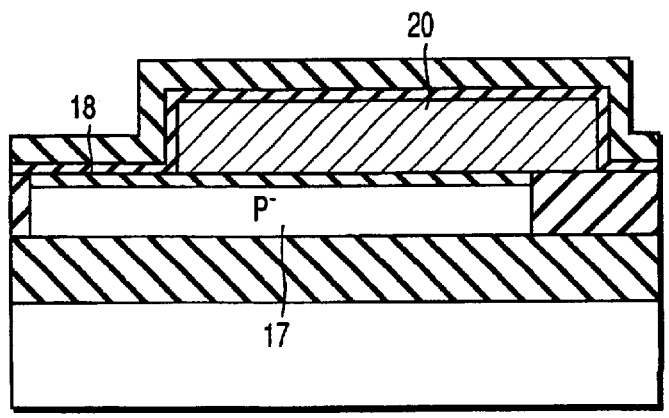

As shown in FIGS. 5A–5C, an oxide film 23 of about 20 nm thick is deposited over the entire surface of the substrate. Further on the oxide film 23, a nitride film 24 of about 70 nm thick is deposited.

Figure 6A:
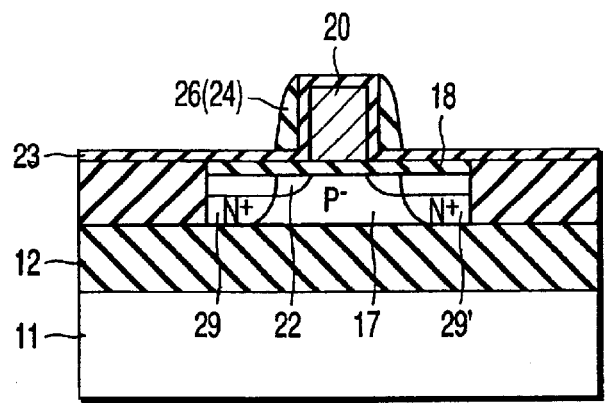
Figure 6B:
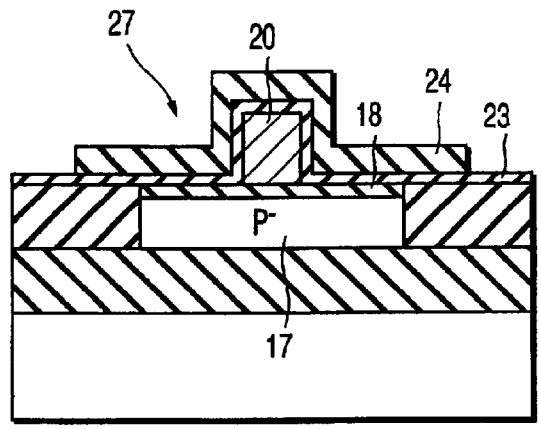

Thereafter, a nitride film 24 is removed in a predetermined pattern by anisotropic etching using a resist pattern 25 of an insulating mask shown in FIG. 8 as a mask. The etching time is adjusted such that the nitride film 24 on the source and drain regions 29, 29' is removed, while leaving the nitride film 24 on the sidewall of the gate electrode 20. As a result, a spacer 26 of the nitride film 24 is formed on the sidewall of the gate electrode 20 (as shown in FIG. 6A) and simultaneously, an insulating mask 27 is formed on the body extension region as shown in FIGS. 6B and 6C.

As a next step, using a resist pattern 28 having an opening for the N-type impurity doping region (shown in FIG. 8) as a mask, a high concentration of N-type impurity ions are doped into the active region 16 to form. N⁺-type source and drain regions 29, 29' adjacent to the gate electrode 20.

Figure 6C:
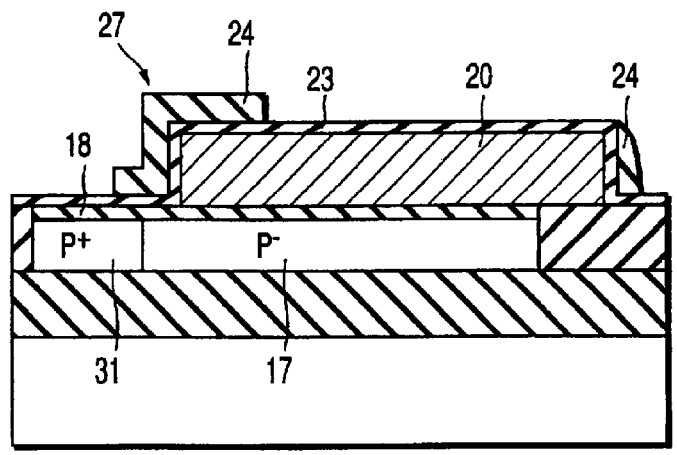

Subsequently, using a resist pattern 30 having an opening for the P-type impurity-doping region (shown. in FIG. 8) as a mask, a high concentration of P-type impurity ions are doped into the active region 16 to form a P⁺-type body contact region 31, as shown in FIG. 6C.

The source and drain regions 29, 29' and the body contact region 31 mentioned above are formed by doping the N-type and P-type impurity ions with an acceleration energy which is not high enough to penetrate the oxidation film 23 and the nitride film 24. In this manner, these impurity ions are prevented from doping into the substrate-potential controlling layer 17 under the insulating mask 27, as shown in FIG. 6B.

Figure 7A:
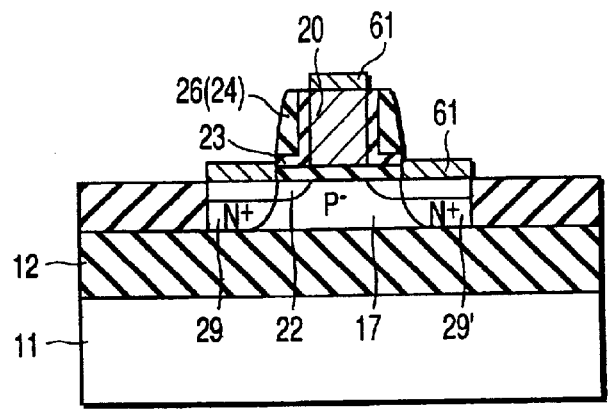
Figure 7B:
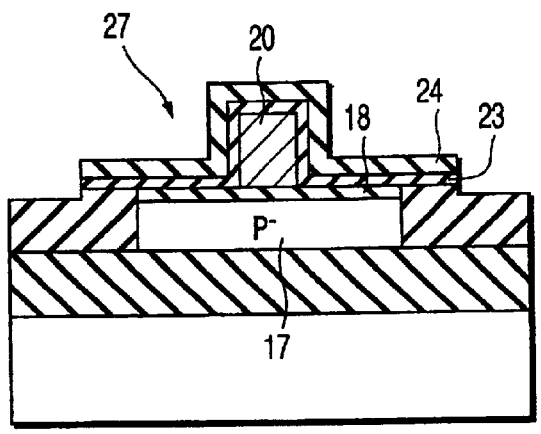
Figure 7C:
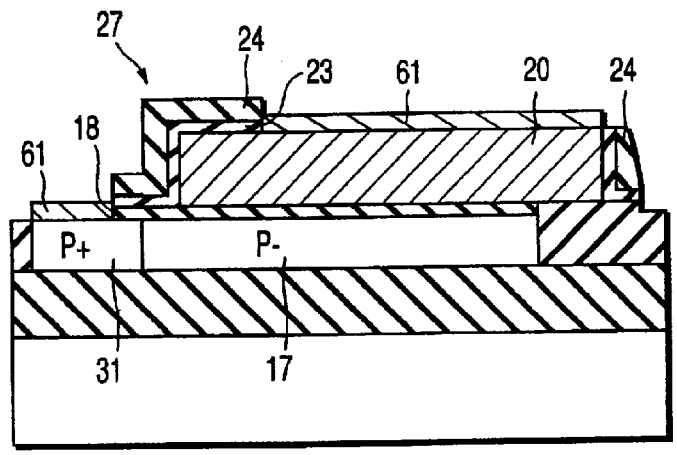
Figure 8:
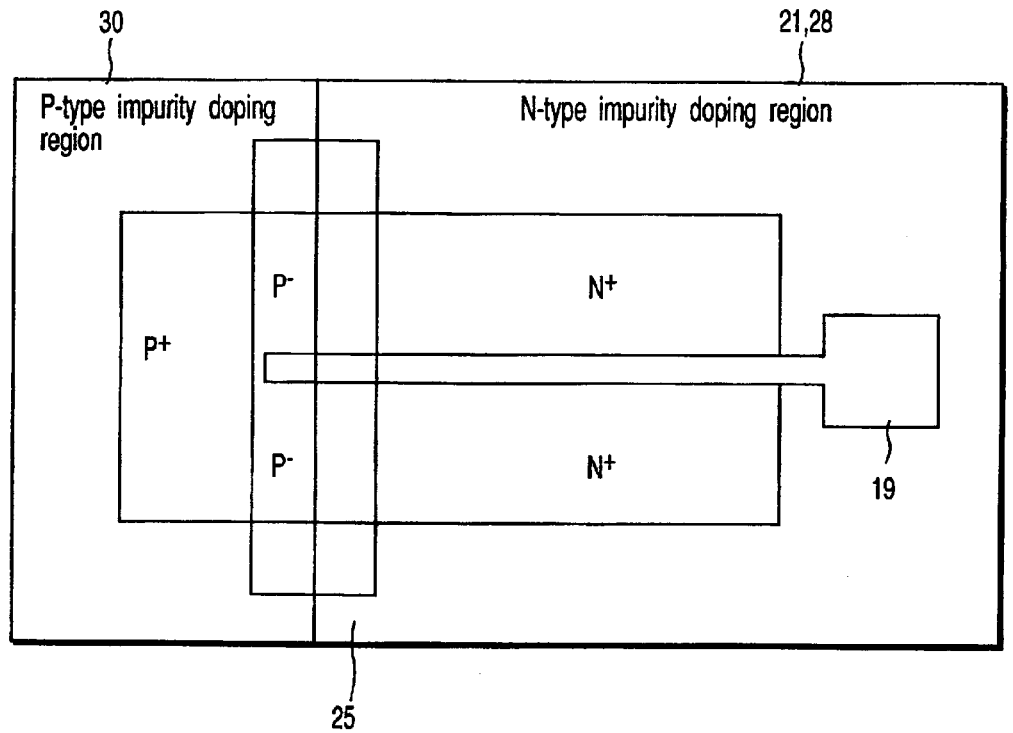
FIG. 8 is a plan view showing a resist mask pattern for use in manufacturing steps of a semiconductor device according to the first embodiment of the present invention.

Next, as shown in FIGS. 7A–7C, the oxide film 23, the nitride film 24, and the field insulating film 15 are removed by wet-etching to expose the surfaces of the body contact region 31, source and drain regions 29, 29', and the gate electrode 20. On the exposed surfaces of the body contact region 31, the source and drain region 29, 29' and the gate electrode 20, a silicide film 61 is formed. Thereafter, a conventional MOS transistor manufacturing process is applied to the resultant structure to realize a MOS transistor.

The silicide film 61 is not necessarily formed. However, the silicide film 61 is useful since it contributes to decreasing the resistances of the body contact region 31, the source and drain regions 29, 29' and the gate electrode 20.

Figure 22:
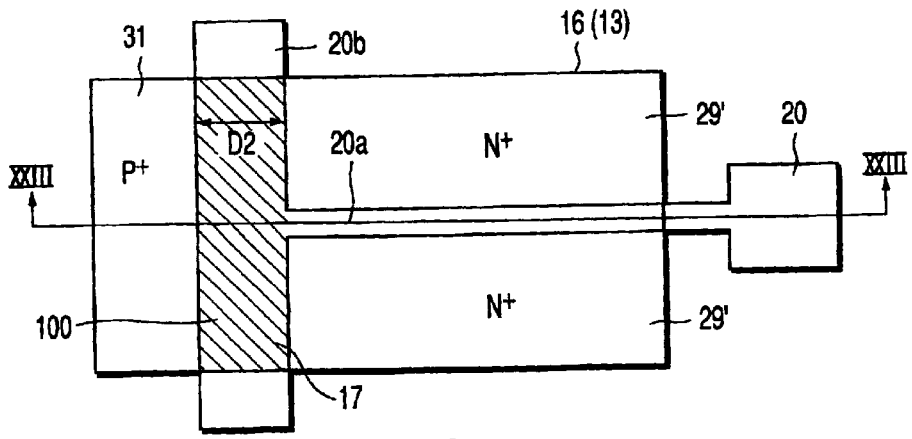
FIG. 22 shows a plan view of a semiconductor device according to a conventional technique.
Figure 23:
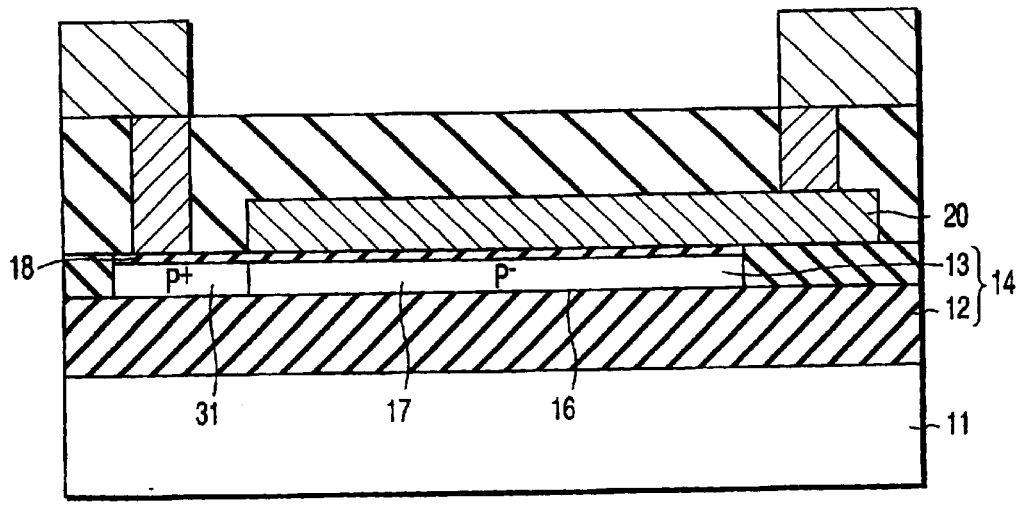
FIG. 23 is a sectional view of a semiconductor device taken along the line XXIII—XXIII of FIGS. 21 and 22.

According to the first embodiment, the gate electrode 20 has a linear pattern which extends from the body region to body extension region. The area of the parasitic gate region 100 of the linear pattern is considerably smaller than that of the T-shaped gate electrode 20 shown in FIG. 22. Hence, the parasitic gate capacitance is reduced, preventing a decrease in switching speed of the circuit. As a result, a highly reliable circuit can be attained with a high performance.

Figure 21:
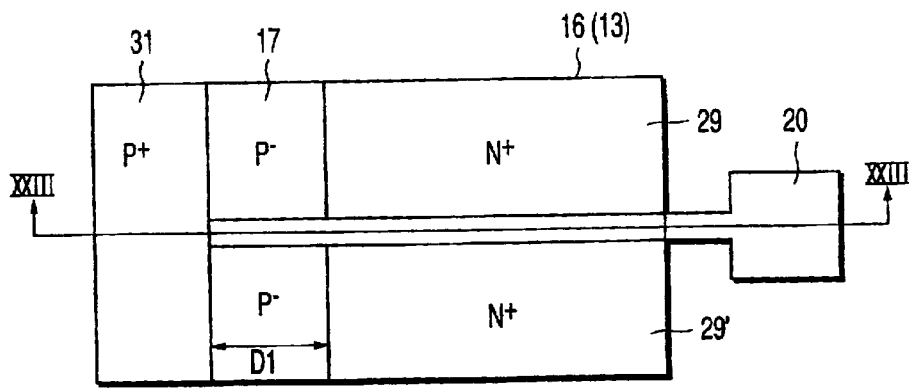
FIG. 21 shows a plan view of a semiconductor device according to a conventional technique.

Since the insulating mask 27 is used as a mask when impurity ions are doped to form the source and drain regions 29, 29' and the body contact region 31. Therefore, high-concentration N-type source and drain regions 29, 29' and high-concentration P-type body contact region 31 are self-aligned with the insulating mask 27 such that the regions 29, 29' are not brought in close contact with the region 31. In other words, the distance between the N-type source and drain regions 29, 29' and the P-type body contact region 31 is determined depending upon the width D of the insulating mask 27 in a self-alignment manner. Therefore, the width D can be reduced up to about 0.3 μm. As explained above, the area occupied by a transistor can be reduced as compared to that of the conventional structure shown in FIG. 21, preventing an increase of a chip area, and reducing the manufacturing cost. In addition, the parasitic resistance is prevented from increasing, thereby controlling the potential of the body region. As a result, it is possible to overcome problems associated with the substrate floating effect such as a decrease of the breakdown voltage and transistor-circuit malfunction.

Furthermore, the insulating mask 27 is formed of the same material (oxide film 23 and nitride film 24) as that of the spacer 26 used for forming the source and drain regions 29, 29'. Thus, the semiconductor device according to the first embodiment can be formed without increasing the manufacturing cost.

In this embodiment, the insulating mask 27 has a stacked structure of the oxide film 23 and the nitride film 24. However, if a single-layered mask is used, the effects of the first embodiment can be obtained.

[Second Embodiment]

In the second embodiment, the pattern of the active region according to the first embodiment is modified to reduce the area of a PN junction. In the second embodiment, explanation is omitted for the like structural elements corresponding to those in the first embodiment, and only different structural elements will be described.

Figure 9:
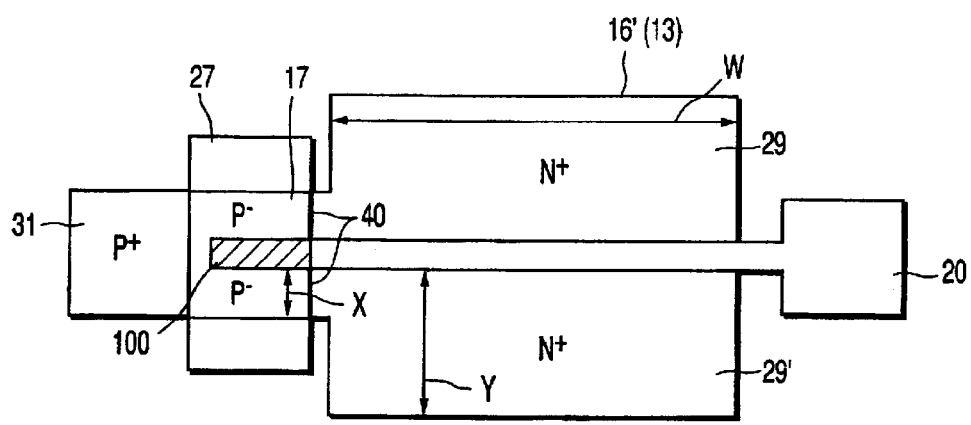
FIG. 9 is a plan view showing a semiconductor device according to a second embodiment of the present invention.

FIG. 9 shows a plan view of a semiconductor structure according to the second embodiment. As shown in FIG. 9, in the semiconductor device of the second embodiment, the distance (width) of an active region 16' in a body region is narrower than that of the active region 16' in a body extension region along the gate length direction of a MOS transistor. Therefore, provided that the distance from a gate electrode 20 to an end of the active region 16' (i.e., a substrate-potential controlling layer 17) in which an insulating film mask 27 is to be formed in the gate length direction is represented by X, and the distance from the gate electrode 20 to an end of a source/drain region 29, 29' (a main length of the drain region 29 or the source region 29) in the gate length direction is represented by Y, the distance X is shorter than the distance Y.

Note that the method of manufacturing a semiconductor device according to the second embodiment is substantially the same as that of the first embodiment except that the body extension region is shorter in width than the body region. Therefore, further explanation will be omitted.

According to the second embodiment, the same effects as those of the first embodiment can be obtained.

Compared to the first embodiment, the semiconductor of the second embodiment has a smaller contact surface 40 between an $N^+$-type diffusion region of the drain region 29 or the source region 29 and a $P^-$-type diffusion region of the substrate-potential controlling layer 17. This means that the length of a parasitic PN junction becomes shorter. As a result, the parasitic capacitance decreases, attaining a high-speed operation of the circuit. Besides this, current leakage decreases, reducing the power consumption of the circuit.

[Third Embodiment]

In a third embodiment, gate electrodes and source and drain regions are formed, with respect to the axis of the body contact region. The gate electrodes are connected to each other and the drain regions (or source regions) are connected to each other to form a single transistor. In the third embodiment, explanation is omitted for the like structural elements corresponding to those in the first embodiment, and only different structural elements will be described.

Figure 10:
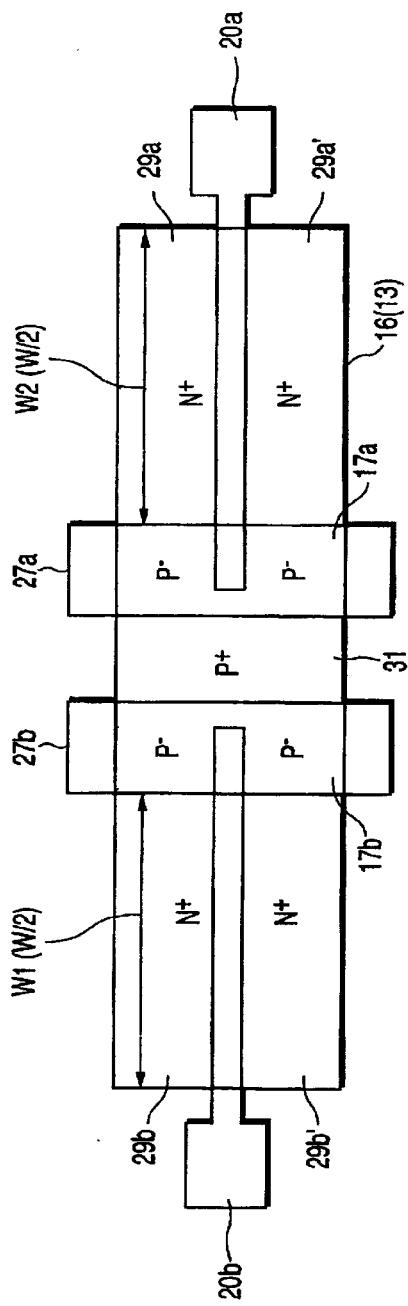
FIG. 10 is a plan view showing a semiconductor device according to a third embodiment of the present invention.

FIG. 10 is a plan view of a semiconductor device according to the third embodiment of the present invention.

As shown in FIG. 10, in the semiconductor device according to the third embodiment, insulating masks 27b, 27a, gate electrodes 20a, 20b, and source/drain regions 29a/29a' and 29b/29b' are symmetrically formed pairwise about the axis of a $p^+$-type body contact region 31. The gate electrodes 20a and 20b are connected by wiring (not shown). Likewise, the source regions 29a and 29b, or the drain regions 29a' 29'b are connected by wiring to form a single transistor.

Figure 11:
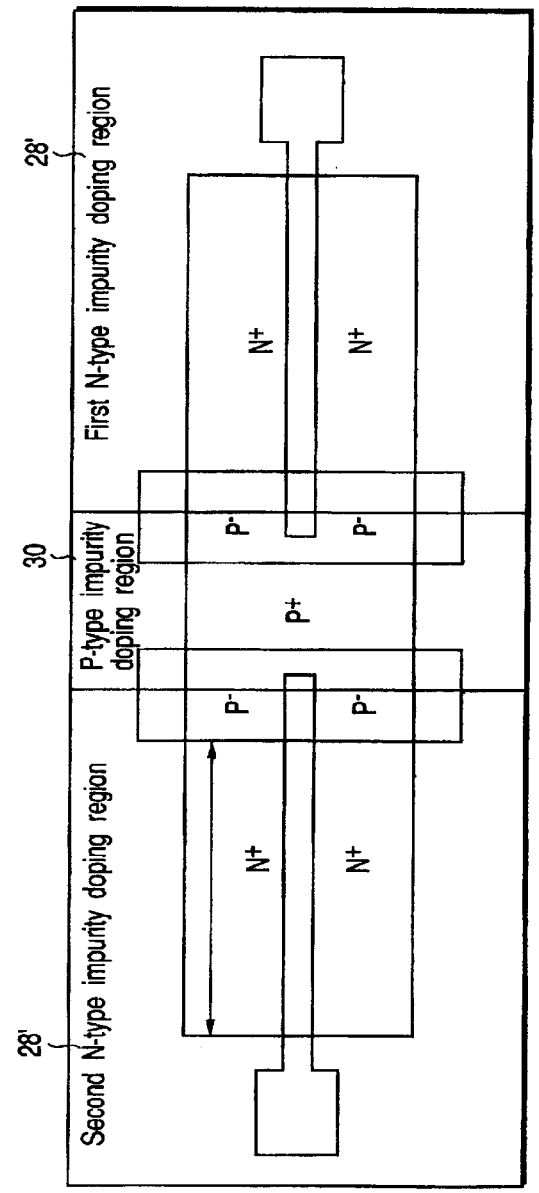
FIG. 11 is a plan view of a resist mask pattern for use in manufacturing steps of a semiconductor device according to a third embodiment of the present invention.

In manufacturing the semiconductor device according to a third embodiment, a high-concentration of N-type impurity ions are doped into an active region 16 by using a resist pattern 28' (shown in FIG. 11) having openings for first and second N-type impurity doping regions as a mask, thereby forming source and drain regions 29a/29a' and 29b/29b'. On the other hand, p-type impurity ions are doped into the active region 16 by using a resist pattern 30 (shown in FIG. 11) having an opening for the P-type impurity doping region as a mask, thereby forming the $P^+$-type body contact region 31. A method of manufacturing the semiconductor device according to a third embodiment is substantially the same as in the first embodiment. Therefore, the explanation of the method will be omitted.

According to the third embodiment, the same effects as those of the first embodiment can be obtained.

Further in the first and second embodiments, an alignment error occurs between the pattern of the active region 16 and the pattern of the insulating mask 27, varying the gate width W (FIGS. 1 and 9). In contrast, in the third embodiment, the gate electrodes 20a, 20b having gate widths of W1, W2, each of which corresponds one half the size of the gate width W shown in FIG. 1, are arranged symmetrically about the line (body contact region 31). By virtue of this arrangement, when the gate width W1 becomes shorter due to the alignment error caused in the insulating mask 27a, the gate width W2 becomes longer since the alignment error simultaneously occurs in the other insulating mask 27b. As a result, a total width W, that is, the sum (W1+W2) of two gate widths will not change. Accordingly, it is possible to obtain a constant current driving of the transistor.

In the third embodiment, the same pattern of the active region 16 as that of the first embodiment is used. However, the pattern of the active region 16' according to the second embodiment may be used herein. In this case, not only the effects of the third embodiment but also the effects of the second embodiment can be obtained.

[Fourth Embodiment]

The structure of a fourth embodiment is effectively used for setting a body contact region and a source region at the same potential. In this case, the insulating mask is positioned at an end portion of the active region. In the fourth embodiment, explanation is omitted for the like structural elements corresponding to those in the first embodiment, and only different structural elements will be described.

Figure 12:
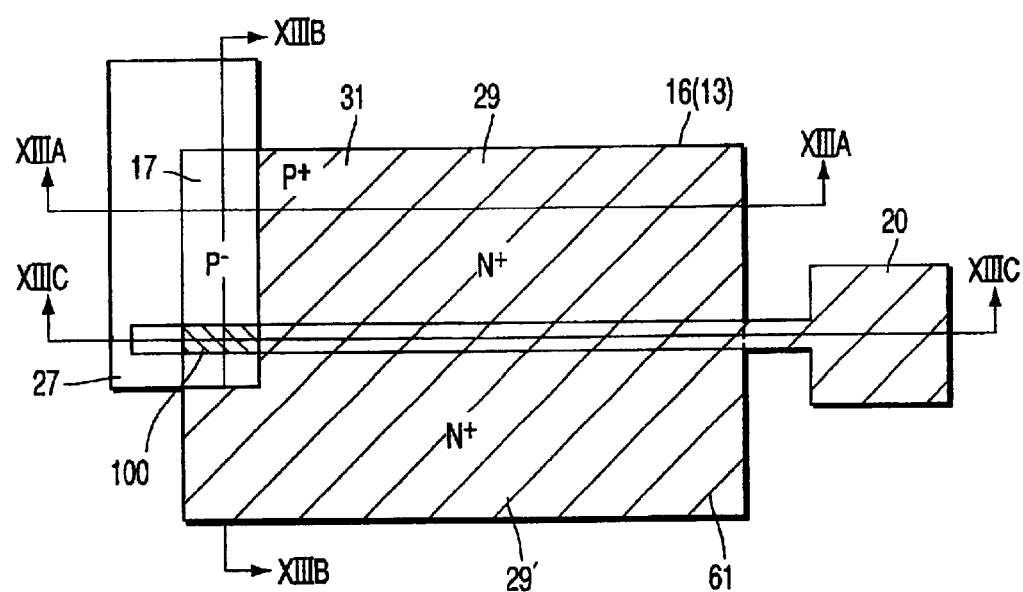
FIG. 12 is a plan view showing a semiconductor device according to a fourth embodiment of the present invention.

FIG. 12 shows a plan view of a semiconductor device according to the fourth embodiment of the present invention.

Figure 13A:
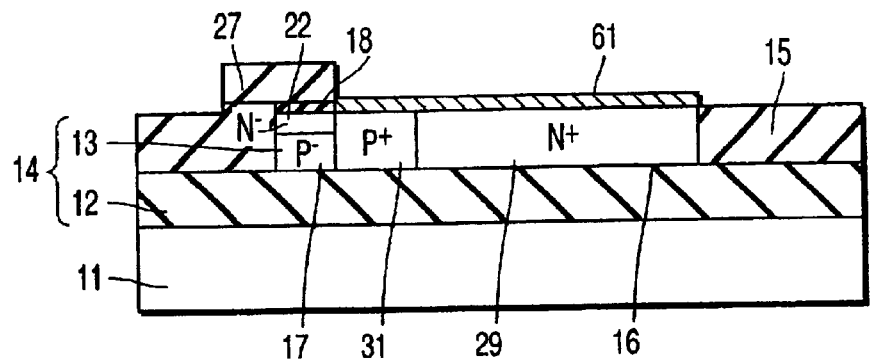
FIG. 13A is a sectional view of a semiconductor device taken along the line XIIIA—XIIIA of FIG. 12.
Figure 13B:
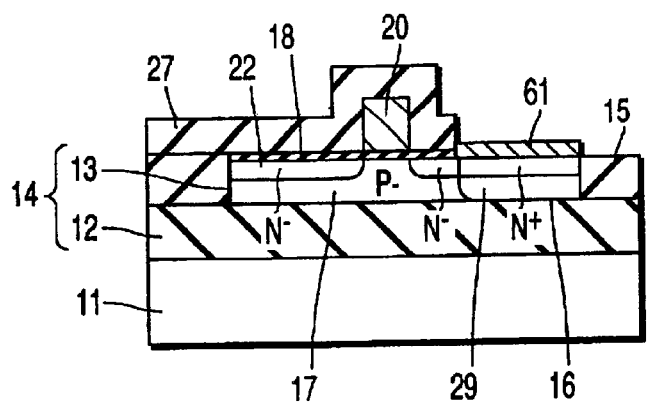
FIG. 13B is a sectional view of a semiconductor device taken along the line XIIIB—XIIIB of FIG. 12.
Figure 13C:
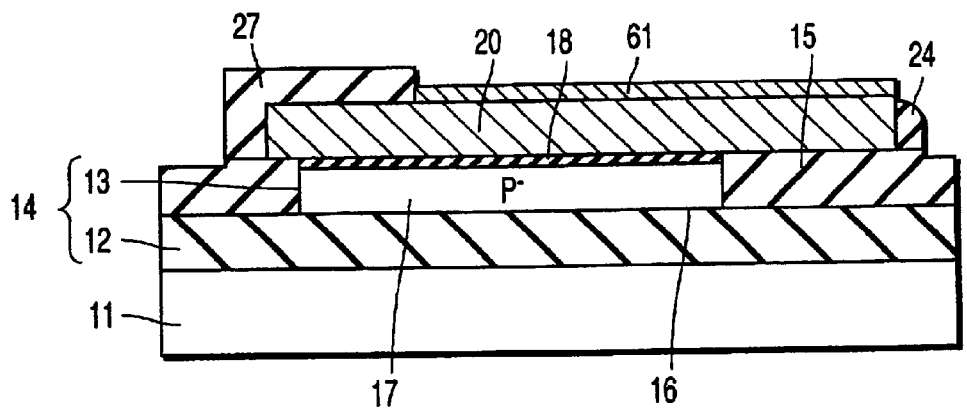
FIG. 13C is a sectional view of a semiconductor device taken along the line XIIIC—XIIIC of FIG. 12.

FIG. 13A is a sectional view of a semiconductor device taken along the line XIIIA—XIIIA of FIG. 12. FIG. 13B is a sectional view of a semiconductor device taken along the line XIIIB—XIIIB of FIG. 12. FIG. 13C is a sectional view of a semiconductor device taken along the line XIIIC—XIIIC of FIG. 12.

As shown in FIGS. 12 and 13A–13C, in the semiconductor device according to the fourth embodiment, a gate electrode 20 is formed across an active region 16 in a linear pattern thereon. An insulating mask 27 is formed at an end portion of the active region 16 and on a part of the gate electrode 20 and a substrate-potential controlling layer 17 so as to cover the gate electrode 20 along the gate-length direction. Furthermore, N⁺-type source and drain regions 29, 29' are formed on the surface of the active region 16 adjacent to the gate electrode 20. A P⁺-type body contact region 31 is formed in contact with the source region 29 and in a part of the periphery of the insulating mask 27 close to the source region 29. The P⁺-type body contact region 31 is arranged at a predetermined distance apart from the gate electrode 20. Under the insulating mask 27, the substrate-potential controlling layer 17 is formed. In the surface of the substrate-potential controlling layer 17, an extension region 22 is formed. Further, a silicide film 61 is formed over the body contact region 31, the source/drain regions 29, 29', and the gate electrode 20. The body contact region 31 is connected to the source region 29 with the silicide film 61.

Since the body contact region 31 and the source region 29 are connected within the semiconductor layer 13, the silicide layer 61 is not necessarily formed on the body contact region 31 and the source region 29. However, the silicide layer 61 is desirably formed. This is because the body contact region 31 and the source region 29 can be more stably kept at the same potential.

The silicide film 61 may be formed in the boundary portion between the body contact region 31 and the source region 29 and may not be necessarily formed on the drain region 29' and the gate electrode 20. However, if the silicide film 61 is formed on the drain region 29' and the gate electrode 20, the resistance of the transistor can be decreased.

Figure 14:
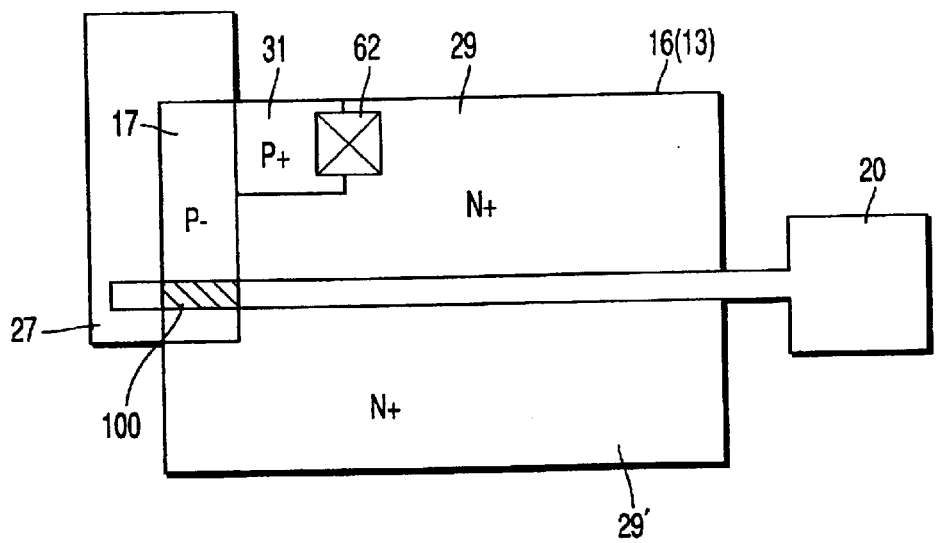
FIG. 14 is a plan view showing another semiconductor device according to a fourth embodiment of the present invention.

The body contact region 31 and the source region 29 are not necessarily connected by use of the silicide film 61 and may be connected by a contact 62 (see in FIG. 14) formed in the boundary portion between them.

The insulating mask 27 is not necessarily formed by extending from the side near the source region 29 to the end portion of the drain region 29' so as to cover the gate electrode 20. For example, taking an alignment error at the time of patterning into consideration, the insulating mask 27 is desirably formed by extending from the side near the source region 29 so as to cover a part of the gate electrode 20. Note that the insulating mask 27 may be formed across the active region 16 along the gate length direction.

The insulating mask 27 may be a stacked film consisting of an oxide film and a nitride film, as is in the first embodiment. Either a single film or a stacked film may be used.

According to the fourth embodiment, the area of a parasitic gate region 100 is considerably reduced as is the same in the first embodiment. Due to this, the parasitic gate capacitance can be reduced, thereby preventing the switching speed of a circuit from decreasing. As a result, highly reliable circuit can be realized with a high performance.

Furthermore, if the structure of the fourth embodiment is applied to a transistor (CMOS inverter) having a diffusion region serving as a source at a predetermined position, it is possible to keep the body contact region 31 and the source region 29 at the same potential since both regions 31 and 29 are in contact with each other. Therefore, problems associated with the substrate floating effect, such as pass-gate leak current, history effect, a decrease of breakdown voltage, can be prevented. As a result, malfunction of the circuit can be prevented. Also, it is not necessary to reduce the operation speed of a circuit to avoid the malfunction.

The pass-gate leak used herein refers to the phenomenon in which a current flows between the source and drain when input (source) is switched from a power supply voltage to a ground potential despite the pass gate circuit consisting of an NMOS transistor being turned off (gate is connected to a ground potential). The history effect refers to the phenomenon where the switching speed of an inverter circuit varies depending upon the frequency of the input pulses.

[Fifth Embodiment]

A fifth embodiment is a modified example of the fourth embodiment. More specifically, the fifth embodiment is substantially the same as the fourth embodiment except that the position of the insulating mask, and therefore the structure of this embodiment is effective in maintaining the body contact region and the source region at the same potential. In the fifth embodiment, explanation is omitted for the like structural elements corresponding to those in the first and fourth embodiments, and only different structural elements will be described.

Figure 15:
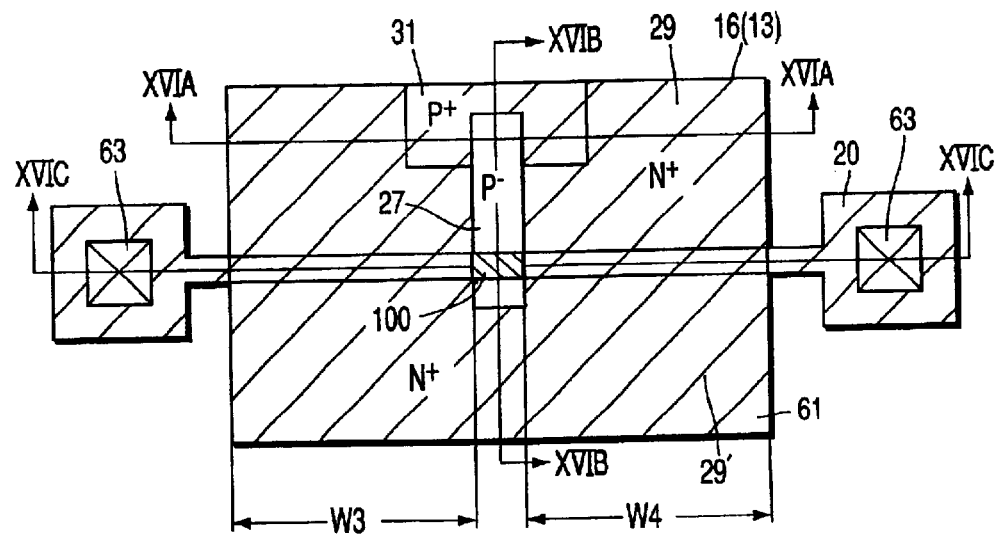
FIG. 15 is a plan view showing a semiconductor device according to a fifth embodiment of the present invention.
Figure 16A:
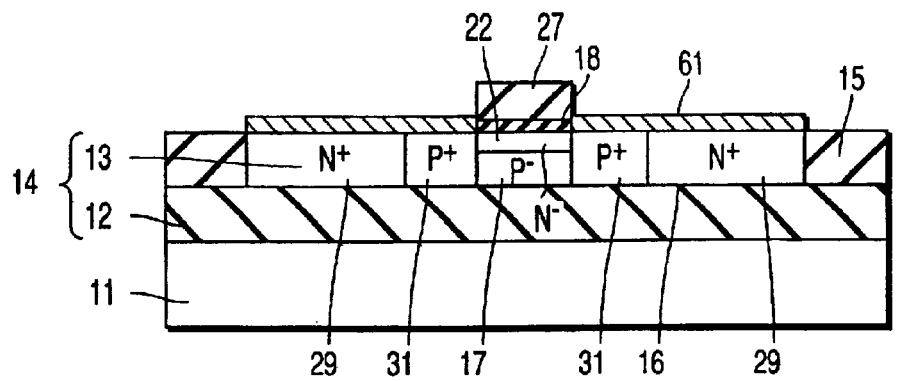
FIG. 16A is a sectional view of a semiconductor device taken along the line XVIA—XVIA of FIG. 15.
Figure 16B:
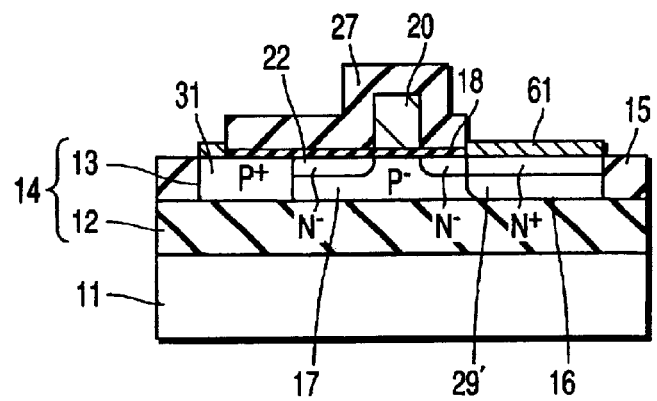
FIG. 16B is a sectional view of a semiconductor device taken along the line XVIB—XVIB of FIG. 15.
Figure 16C:
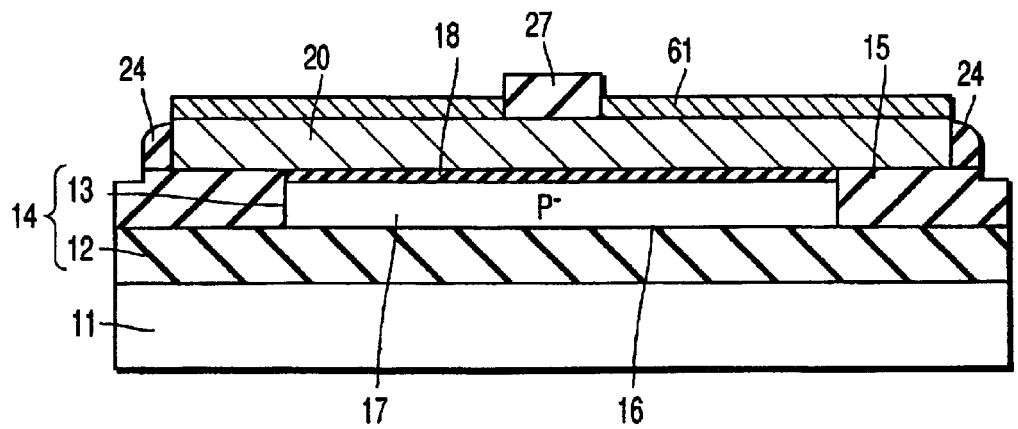
FIG. 16C is a sectional view of a semiconductor device taken along the line XVIC—XVIC of FIG. 15.

FIG. 15 is a plan view showing a semiconductor device according to a fifth embodiment of the present invention. FIG. 16A is a sectional view of a semiconductor device taken along the line XVIA—XVIA of FIG. 15. FIG. 16B is a sectional view of a semiconductor device taken along the line XVIB—XVIB of FIG. 15. FIG. 16C is a sectional view of a semiconductor device taken along the line XVIC—XVIC of FIG. 15.

As is shown in FIGS. 15, and 16A–16C, the semiconductor device according to a fifth embodiment has an insulating mask 27 arranged at the center of the active region 16 and covering a part of the gate electrode 20. In the periphery of a part of an insulating mask 27 near a source region 29, a P⁺-type body contact region 31 is formed in contact with the source region 29. Furthermore, a silicide film 61 is formed on the body contact region 31, source and drain regions 29, 29', and the gate electrode 20, and connects between the source region 29 and the body contact region 31.

If the insulating mask 27 is arranged in the center portion of the active region 16, there is a region without the silicide film 61 on the gate electrode 20 across the active region 27 due to the presence of the insulating mask 27. To reduce the gate resistance, a contact 63 is desirably formed at each of both ends of the gate electrode 20.

According to the fifth embodiment, the area of the parasitic gate region 100 is considerably reduced in the same as in the first embodiment, thereby decreasing the parasitic gate capacitance. It is thus possible to prevent the switching speed of a circuit from decreasing. As a result, a highly-reliable circuit can be realized with a high performance.

The body contact region 31 and the source region 29 can be maintained at the same potential as is in the same way as in the fourth embodiment. It is therefore possible to prevent problems associated with the substrate floating effect, such as pass-gate leak current and history effect, and a decrease in breakdown voltage.

In the fifth embodiment, when an alignment error occurs between the insulating mask 27 and the active region 16, the first gate width W3 reduces whereas the second gate width W4 increases. Alternatively, the first gate width W3 increases, whereas the second gate width W4 decreases. Therefore, even if the alignment error occurs, the total gate width of the first gate width W3 and the second gate width W4 does not change. Consequently, it is possible to prevent the current driving of a transistor from varying.

[Six Embodiment]

A sixth embodiment is an example in which a lattice defect is formed in the vicinity of a PN junction. In the sixth embodiment, explanation is omitted for the like structural elements corresponding to those in the first embodiments, and only different structural elements will be described.

Figure 17:
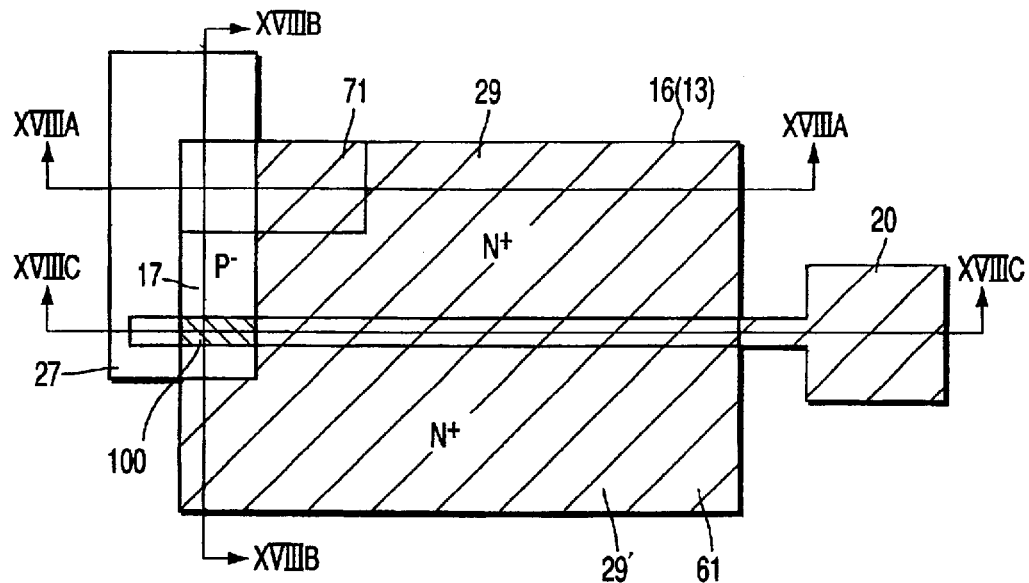
FIG. 17 is a plan view showing a semiconductor device according to a sixth embodiment of the present invention.

FIG. 17 is a plan view showing a semiconductor device according to a sixth embodiment of the present invention.

Figure 18A:
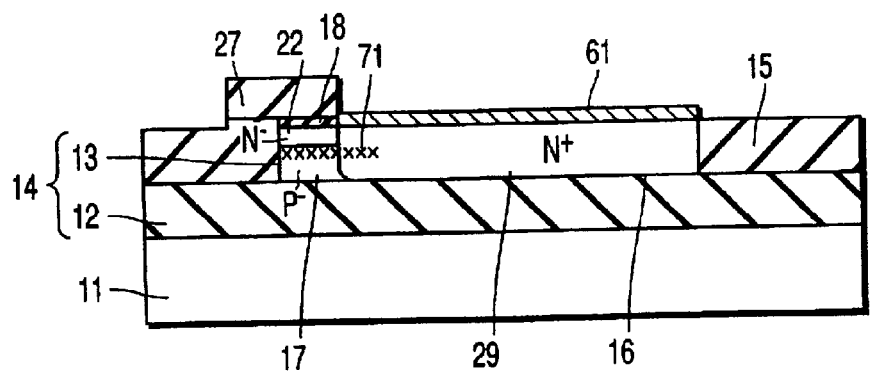
FIG. 18A is a sectional view of a semiconductor device taken along the line XVIIIA—XVIIIA of FIG. 17.
Figure 18B:
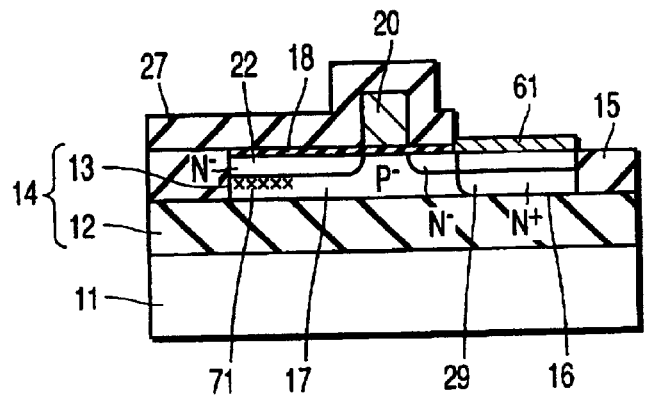
FIG. 18B is a sectional view of a semiconductor device taken along the line XVIIIB—XVIIIB of FIG. 17.
Figure 18C:
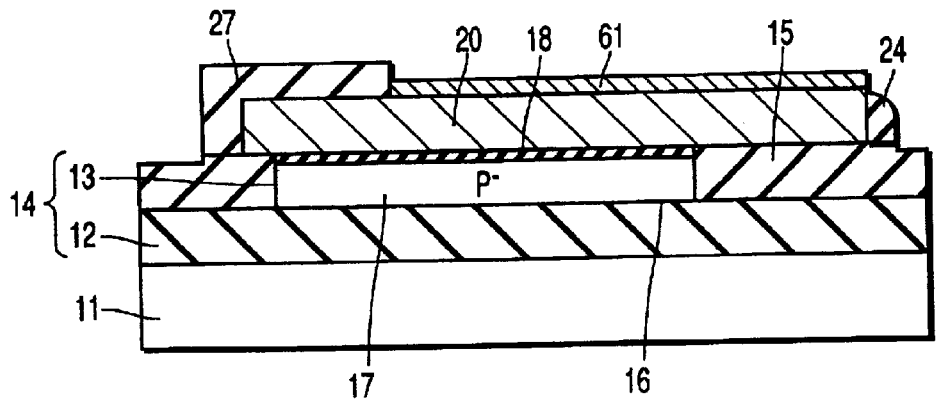
FIG. 18C is a sectional view of a semiconductor device taken along the line XVIIIC—XVIIIC of FIG. 17.

FIG. 18A is a sectional view of a semiconductor device taken along the line XVIIIA—XVIIIA of FIG. 17. FIG. 18B is a sectional view of a semiconductor device taken along the line XVIIIB—XVIIIB of FIG. 17. FIG. 18C is a sectional view of a semiconductor device taken along the line XVIIIC—XVIIIC of FIG. 17.

As shown in FIG. 17 and FIGS. 18A–18C, in the semiconductor device according to the sixth embodiment, a lattice defect region 71 is formed in an active region 16 on a side close to a source region 29 at a predetermined distance apart from a gate electrode 20. The lattice defect region 71 is extended from between an extension region 22 and the substrate-potential controlling layer 17 formed under the insulating mask 27 to the source region 29. In other words, the lattice defect region 71 is formed not only in the proximity of the PN junction formed between the N$^-$-type extension region 22 and the P$^-$-type substrate potential controlling region 17 but also in the proximity of the PN junction formed between the P$^-$-type substrate potential controlling region 17 and the N$^+$-type source region 29.

Incidentally, it is desirable that the lattice defect region 71 be present in the proximity of the PN junction formed between the substrate-potential controlling region 17 and the source region 29. It is also desirable that the lattice defect region 71 may be formed at a position deeper than the lower surface of the extension region 22. More specifically, the lattice defect region 71 may be formed at a shallow position which permits contact with the extension region 22 or at a deep position which permits contact with the buried oxide film 12.

Figure 19:
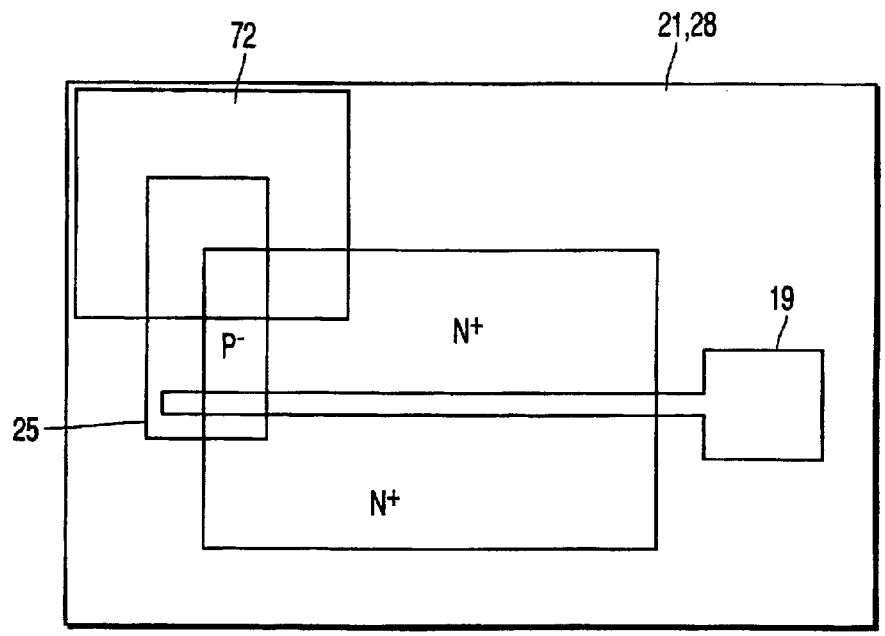
FIG. 19 is a plan view showing a resist mask pattern for use in manufacturing steps of a semiconductor device according to the sixth embodiment of the present invention.

FIG. 19 is a plan view showing a resist mask pattern for use in manufacturing steps of a semiconductor device according to the sixth embodiment of the present invention. The method of manufacturing the semiconductor device according to the sixth embodiment differs from that according to the first embodiment in the point that the lattice defect region 71 is formed and the body contact region 31 is not formed. The lattice detect region 71 is, for example, formed as follows.

At the first place, a resist pattern 72 (shown in FIG. 19) is formed having an opening for the lattice defect region 71. The resist pattern 72 is formed in such a manner that the opening does not reach the side of the drain region 29' even if an alignment error occurs. Using the resist pattern 72 as a mask, argon ions are implanted into the opening in a dose amount of $1\times10^{14}/cm^{-2}$. Thereafter, the resultant structure is subjected to heat treatment to recrystallize the region 71 having argon ions doped therein. The region 71 contains lattice defects in a higher concentration than other regions. In this manner, the lattice defect region 71 is formed.

As long as crystal defects are generated in the semiconductor layer 13, the lattice defect region 71 can be formed. Therefore, the method of forming the lattice defect region is not limited to an ion-doping method. Irradiating the semiconductor layer 13 with an electron beam and a gamma beam can form the lattice defect region.

The timing for forming the lattice defect region 71 is not particularly limited. The lattice defect region 71 may be formed after the P$^-$-type substrate-potential controlling layer 17 is formed or after the insulting mask 72 is formed.

The impurity to be doped is not limited to argon. Germanium and silicon may be used.

According to the sixth embodiment, the area of the parasitic gate region 100 can be considerably reduced in the same manner as in the first embodiment, thereby reducing the parasitic gate capacitance.

Further in the sixth embodiment, the lattice defects formed in the source region 29 act as a recombination center. Therefore, a recombination current of the PN junction between the source and body increases. It follows that the potential difference between the body and source decreases when a transistor is turned off, decreasing the leak current, and preventing malfunction of the circuit. As a result, the power consumption of the circuit decreases.

Note that the technique for forming the recombination center has been proposed for long. For example, Japanese Patent Application No. 5-52672 proposes a structure having a trapping center of the level of energy which has nearly a half of a band gap of the semiconductor layer. If the trapping center is formed over the entire active region, it increases junction leak current flowing in a reverse direction in the PN junction between the drain region and the body region. This increase cancels out the effect of reducing the leak current by increasing the recombination current in a normal direction. As a result, the leak current increases in some cases.

To prevent this problem, Japanese Patent Application No. 61-43475 proposes a structure having a trapping center only in the PN junction between the source region and the body region. However, in the case where the gate length is 100 nm or less, the alignment error of the resist pattern is larger. It is thus quite difficult to form a resist pattern having an opening for ion doping only at the source side.

To overcome the aforementioned problems, in the sixth embodiment, a body extension region is formed by the insulating mask 27 even in the transistor having a gate length of 100 nm or less and the lattice defect region 71 serving as a recombination center is formed in the PN Junction between the source region 29 and the body extension region. Furthermore, the concentration of the recombination center is adjusted and the magnitude of the recombination current is controlled, thereby reducing the potential difference between the body and source during a transistor being turned off. In addition, the lattice defect region 71 is not formed at the side of the drain region 29', so that the leak current of the reverse direction between the drain region 29' and the body region does not increase.

The present invention is not limited to the aforementioned embodiments and may be modified in various ways in the practice of the invention within the scope of the gist of the present invention. More specifically, a semiconductor device using an SOI substrate is explained in the aforementioned embodiments. However, a general bulk substrate 81 may be used as shown in FIG. 20. Also, in the aforementioned embodiments, an NMOS transistor is explained as an example. However, if N-type and P-type may be interchangeably used appropriately, the embodiments may be applied to a PMOS transistor.

Moreover, the embodiments include various stages of the invention. If a plurality of structural elements disclosed above are appropriately combined, various inventions may be extracted.

What is claimed is:

1. A semiconductor device comprising:
   a semiconductor layer of a first conductive type formed in an active region;
   a first gate electrode formed on the semiconductor layer via a gate insulating film in a predetermined pattern and having an end portion arranged in the active region;
   a first insulating mask formed on at least a part of the first gate electrode and a part of the semiconductor layer, said first insulating mask being arranged on said end portion of the first gate electrode and on the semiconductor layer to cross the active region along a gate length direction of the first gate electrode;
   a pair of first diffusion regions of a second conductive type formed in the active region not covered with the first insulating mask and the first gate electrode, said pair of first diffusion regions being positioned adjacent to the first gate electrode and being used as a source and drain; and
   a spacer formed in a region where the first insulating mask is not formed, and only on a sidewall of the first gate electrode, said spacer being formed of a same material as the first insulating mask.

2. The semiconductor device according to claim 1, wherein said first gate electrode formed on the semiconductor layer is substantially linear.

3. The semiconductor device according to claim 1, further comprising an insulating film formed under the semiconductor layer.

4. A semiconductor device comprising:
   a semiconductor layer of a first conductive type formed in an active region;
   a first gate electrode formed on the semiconductor layer via a gate insulating film in a predetermined pattern and having an end portion arranged in the active region;
   a first insulating mask formed on at least a part of the first gate electrode and a part of the semiconductor layer, said first insulating mask being arranged on said end portion of the first gate electrode and on the semiconductor layer to cross the active region along a gate length direction of the first sate electrode;
   a pair of first diffusion regions of a second conductive type formed in the active region not covered with the first insulating mask and the first gate electrode, said pair of first diffusion regions being positioned adjacent to the first gate electrode and being used as a source and drain;
   a spacer formed on a sidewall of the first gate electrode, said spacer being formed of a same material as the first insulating mask; and
   a second diffusion region of the first conductive type positioned adjacent to the first insulating mask and formed at an opposite side of the first diffusion region, said second diffusion region containing a higher impurity concentration than the semiconductor layer.

5. The semiconductor device according to claim 4, wherein said first gate electrode is arranged in a first direction and comprises a first portion and a second portion, said first portion is positioned under the first insulating mask, and a distance between an end of the first portion and an end of the semiconductor layer in a second direction vertical to the first direction is shorter than a distance between an end of the second portion and an end of the first diffusion region in the second direction.

6. The semiconductor device according to claim 4, wherein a second gate electrode, a second insulating mask and a third diffusion region are symmetrically formed to the first gate electrode, the first insulating mask and the first diffusion region, with respect to an axis of the second diffusion region; and
   said first gate electrode is connected to said second gate electrode, and said first diffusion region is connected to said third diffusion region.

7. The semiconductor device according to claim 4, wherein said first diffusion region and said second diffusion region are separated at a predetermined interval, and said predetermined interval is a width of the first insulating mask.

8. A semiconductor device comprising:
   a semiconductor layer of a first conductive type formed in an active region;
   a first gate electrode formed on the semiconductor layer via a gate insulating film in a predetermined pattern and formed across the active region;
   a first insulating mask formed on at least a part of the first gate electrode and a part of the semiconductor layer;
   a pair of first diffusion regions of a second conductive type formed in the active region not covered with the first insulating mask and the first gate electrode, said pair of first diffusion regions being positioned adjacent to the first gate electrode and being used as a source and drain, said first insulating mask being extended from a position on the semiconductor layer of one of the pair of the first diffusion regions to a position on a part of the first gate electrode; and
   a spacer formed in a region where the first insulating mask is not formed, and only on a sidewall of the first gate electrode, said spacer being formed of a same material as the first insulating mask.

9. The semiconductor device according to claim 8, further comprising a lattice defect region formed in a proximity of a boundary between the semiconductor layer under the first insulating mask and the one of the pair of the first diffusion regions.

10. The semiconductor device according to claim 9, further comprising a fourth diffusion region of the second conductive type formed on a surface of the active region under the first insulating mask, said fourth diffusion region containing a lower impurity concentration than the first diffusion region.

11. The semiconductor device according to claim 10, wherein said lattice defect region is also formed in the proximity of a boundary between the semiconductor layer and the fourth diffusion region.

12. A semiconductor device comprising:
   a semiconductor layer of a first conductive type formed in an active region;
   a first gate electrode formed on the semiconductor layer via a gate insulating film in a predetermined pattern and formed across the active region;
   a first insulating mask formed on at least a part of the first gate electrode and a part of the semiconductor layer;
   a pair of first diffusion regions of a second conductive type formed in the active region not covered with the first insulating mask and the first gate electrode, said pair of first diffusion regions being positioned adjacent to the first gate electrode and being used as a source and drain, said first insulating mask being extended from a position on the semiconductor layer of one of the pair of the first diffusion regions to a position on a part of the first gate electrode;
   a spacer formed on a sidewall of the first gate electrode, said spacer being formed of a same material as the first insulating mask; and a second diffusion region of the first conductive type formed in the active region around the first insulating mask and positioned adjacent to one of the pair of the first diffusion regions, said second diffusion region containing a higher impurity concentration than the semiconductor layer.

13. The semiconductor device according to claim 12, wherein said first insulating mask is formed on an end portion of the active region.

14. The semiconductor device according to claim 12, wherein said first insulating mask is formed at a center of the active region.

15. The semiconductor device according to claim 12, further comprising a silicide film formed on a boundary surface between one of the pair of the first diffusion regions and the second diffusion region.

16. The semiconductor device according to claim 12, further comprising a contact formed on a boundary surface between one of the pair of the first diffusion regions and the second diffusion region.

17. The semiconductor device according to claim 12, wherein said one of the pair of the first diffusion regions and the second diffusion region comprise a same potential.

* * * * *